(12) United States Patent
Kwon et al.

(10) Patent No.: US 7,515,263 B2
(45) Date of Patent: Apr. 7, 2009

(54) OPTICAL SPARK MODE DISCRIMINATOR METHODS AND SYSTEMS

(75) Inventors: Eddie Kwon, Seattle, WA (US); Arthur C. Day, Seattle, WA (US)

(73) Assignee: The Boeing Company, Chicago, IL (US)

( * ) Notice: Subject to any disclaimer, the term of this patent is extended or adjusted under 35 U.S.C. 154(b) by 308 days.

(21) Appl. No.: 11/382,192

(22) Filed: May 8, 2006

(65) Prior Publication Data

US 2007/0258090 A1 Nov. 8, 2007

(51) Int. Cl.
*G01J 3/28* (2006.01)
*G01N 30/02* (2006.01)

(52) U.S. Cl. .................................. 356/326; 356/313

(58) Field of Classification Search ................. 356/326
See application file for complete search history.

(56) References Cited

U.S. PATENT DOCUMENTS

| 4,941,669 | A | * | 7/1990 | Fujisawa et al. ............. 277/444 |
| 5,285,251 | A | * | 2/1994 | Pilloud et al. ................ 356/313 |
| 5,659,133 | A | * | 8/1997 | Sims et al. .................... 73/114.09 |
| 6,455,850 | B1 | * | 9/2002 | Coates et al. ............... 250/338.1 |
| 6,903,357 | B2 | | 6/2005 | Robb |
| 7,202,948 | B2 | * | 4/2007 | Buckley et al. .............. 356/318 |
| 2005/0024639 | A1 | * | 2/2005 | Fretel et al. ................. 356/326 |

OTHER PUBLICATIONS

Haight, et al., "Measurements of Some Parameters of Thermal Sparks With Respect to Their Ability to Ignite Aviation Fuel/Air Mixtures", Culham Lighting, Test and Technology, ICOLSE—1994, 10 pages.

\* cited by examiner

*Primary Examiner*—L. G Lauchman
*Assistant Examiner*—Rebecca C Slomski
(74) *Attorney, Agent, or Firm*—Lee & Hayes, PLLC

(57) ABSTRACT

Methods and systems for discriminating among sparking modes are disclosed. In one embodiment, a method includes receiving light from a spark into a spectrometer, generating a light intensity spectrum using the spectrometer, and classifying the sparking mode based on an analysis of the light intensity spectrum. The light intensity spectrum may be analyzed for the presence of an atomic emission and a broad blackbody emission. In further embodiments, light emitted by the spark may be received into a photodetector, and the classification of the sparking mode may be based on an analysis of an intensity profile, including at least one of a rise-time phase, a peak intensity, and a drop-off phase.

20 Claims, 7 Drawing Sheets

Note: All IC power pins bypassed with 0.1 uF

OPTICAL SPARK MODE DISCRIMINATOR METHODS AND SYSTEMS

FIELD OF THE INVENTION

This invention relates to methods and systems for discriminating among various modes of sparking by composite materials, including voltage and thermal-induced sparking.

BACKGROUND OF THE INVENTION

Sparks and electrical breakdowns in composite materials are presently the subject of extensive research and development. Sparking by composite materials is a complex phenomenon, and may result from different sources or modes, including high voltage loads and high thermal loads. The ever-increasing use of composite materials is driving the need to better analyze and discriminate between the different modes that cause sparking of composite materials.

In the aerospace industry, for example, the use of composite materials is being extended to many aircraft components that have historically been fabricated using metals, such as airframes and fuselage structures. The possibility of lightning strikes of such composite components increases the potential for a range of events, including ejection of hot particles from fastened joints where currents pass between metal fasteners and other structural elements, edge glow (or edge incandescence) at cut edges of composite spars and stringers, electrical breakdown between plies within composite materials that results in volatilization of resin material and forced expulsion of this material through formation of cracks, hot soot and gas plumes resulting from such expulsion, and electrical breakdown between metal fastener pins and other metal parts, such as fastener collars, shear ties, or metallic ribs. Possible effects of the heating due to a lightning strike of a composite component may include delamination of the structural plies, microscopic cracks in the composite, and the formation of small pyrolized or mass-depleted regions.

The phenomena commonly referred to as edge glow has also been referred to by other names, including surface glow, edge incandescence, edge sparking, and composite sparking. These names all reflect aspects of things known or suspected about the phenomena, and some may be good descriptions in some circumstances and not in others. In the past, edge glow has been detected by traditional Polaroid photographic methods such as that described in Aerospace Recommended Practice (ARP) 5416. However, the different light output of edge glow, as compared with that from electrical breakdown arcs, will mean that the film could respond differently even for equivalent amounts of energy. The threshold for detection of electrical breakdown arcs by the method of ARP5416 is approximately 200 microjoules.

Relatively little is known about edge glow or other composite sparking sources. Unknowns include the energy, temperature, and duration of edge and surface events, how event characteristics will impact the ability to detect light on film, the degree to which these events are driven by interply voltage arcs that occur at exposed edges, the size and composition of emitted material, the depths from which edge glow originates, and the role of surface condition.

Due to the potential importance of the composite material sparking phenomenon, improved methods and systems for analyzing and discriminating between various modes of composite sparking would have utility. Of particular importance to the aerospace industry are methods and systems that can be implemented easily for the large number and variety of tests that are needed to support aircraft certification by governmental authorities.

SUMMARY OF THE INVENTION

The present invention provides methods and systems for analyzing and discriminating among various modes of sparking by composite materials. Embodiments of the present invention may advantageously provide improved characterization of the energy and duration of a spark using a relatively low cost, compact, and versatile apparatus.

In one embodiment, a method of classifying a sparking mode of a workpiece includes receiving light from a spark emitted by the workpiece; transmitting the received light to a spectrometer; generating a light intensity spectrum from the received light using the spectrometer; analyzing the light intensity spectrum; and classifying the sparking mode based on the analysis of the light intensity spectrum. The analyzing of the light intensity spectrum may include analyzing the light intensity spectrum for the presence of an atomic emission and a broad blackbody emission.

In further embodiments, the method also includes receiving a second portion of light emitted by the spark into at least one photodetector; determining at least one intensity profile; analyzing the intensity profile; and classifying the sparking mode based on the analysis of the intensity profile. The analyzing of the intensity profile may include analyzing at least one of a rise-time phase, a peak intensity, and a drop-off phase.

BRIEF DESCRIPTION OF THE DRAWINGS

Embodiments of the present invention are described in detail below with reference to the following drawings.

DETAILED DESCRIPTION

The present invention relates to methods and systems for analyzing and discriminating among various modes of sparking by composite materials. Many specific details of certain embodiments of the invention are set forth in the following description and in FIGS. 1 through 12 to provide a thorough understanding of such embodiments. One skilled in the art, however, will understand that the present invention may have additional embodiments, or that the present invention may be practiced without several of the details described in the following description.

In general, embodiments of the present invention may provide improved capabilities for analyzing and discriminating between various modes of composite material sparking. More specifically, embodiments of the invention may enable improved characterization of the energy and duration of a spark, and may provide capabilities to analyze the spectral and temporal characteristics of different sparks for the purpose of analyzing and classifying the mode by which the sparks were induced. Relatively low cost, compact, and versatile methods and systems in accordance with the invention may advantageously be used for a large number and variety of tests that are needed to support aircraft certification.

Figure 1:
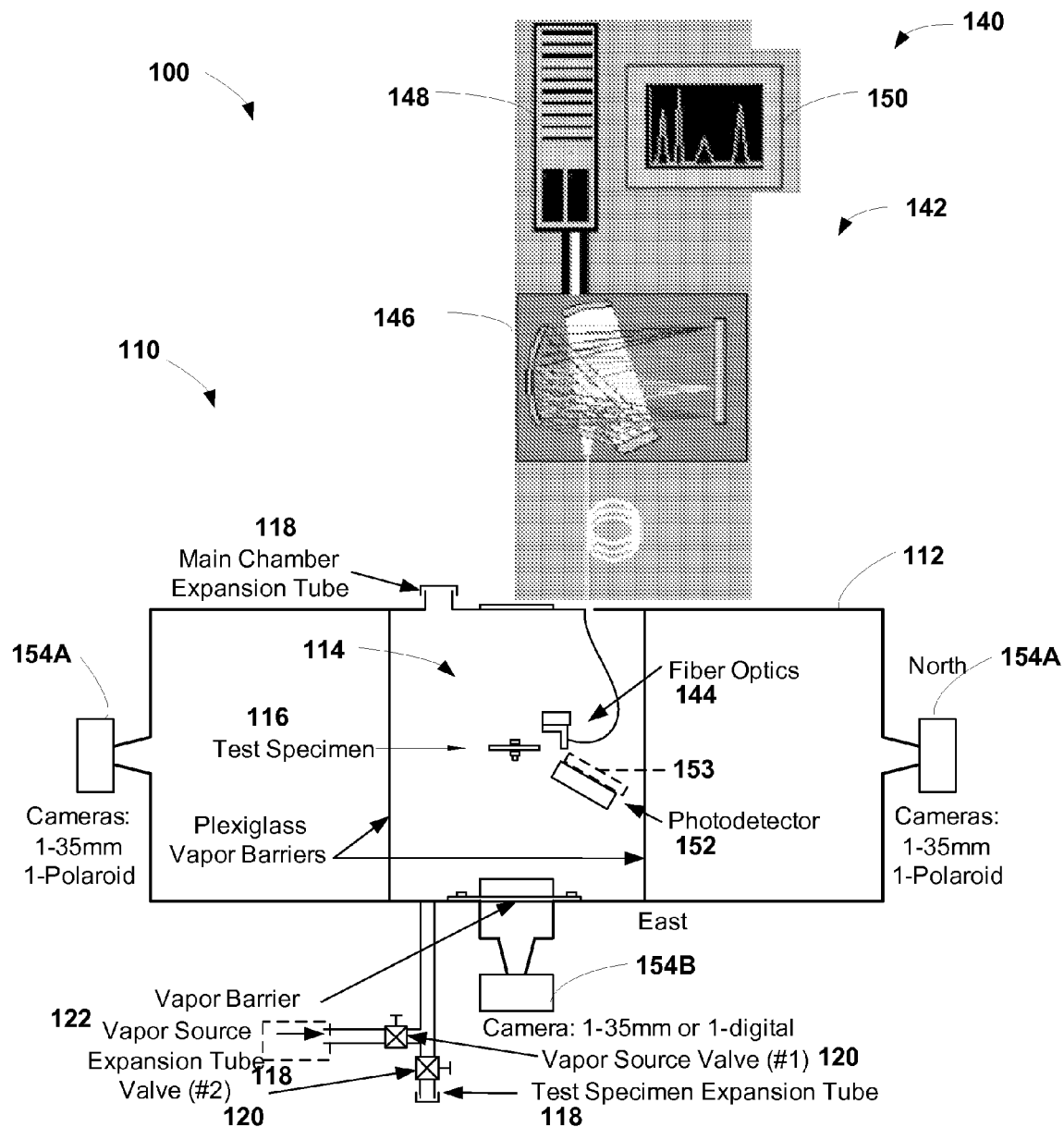
FIG. 1 is a top view of an optical spark mode discriminator system in accordance with an embodiment of the present invention.

FIG. 1 is a top view of an optical spark mode discriminator system 100 in accordance with an embodiment of the present invention. In this embodiment, the system 100 includes a test assembly 110 having a chamber 112 that encloses a test section 114. A test specimen (or coupon) 116 of a composite material is positioned within the test section 114. The chamber 112 generally includes one or more ports 118 and valves 120 that provide a desired capability to controllably adjust environmental conditions within the chamber 112 and test section 114. For example, as is known in the art, the one or more ports 118 and valves 120 may be operatively coupled to a vapor source 122 for controlling humidity within the chamber 112, or to a pump or other suitable pressure source for controlling pressures within the chamber 112 (e.g. vacuum or overpressure), or for the introduction of ignitable test gases, or for the removal of post-test gases. The ports 118 and valves 120 may also serve as a pressure relief system for preventing excessive pressures from developing within the chamber 112.

The system 100 further includes a data acquisition system 140 having a spectroscopy assembly 142. In this embodiment, the spectroscopy assembly 142 includes an optical fiber 144 having a first end proximate the test specimen 116 and a second end operatively coupled to a spectrometer 146. A processing component 148 (e.g. a computer, oscilloscope, etc.) is coupled to the spectrometer 146 and to a display 150 that provides a visual representation of data acquired during a test. In one particular embodiment, the spectrometer 146 is a visible-band spectrometer, such as the Model HR4000 Spectrometer commercially-available from Ocean Optics, Inc. of Dunedin, Fla. In alternate embodiments, any suitable visible and non-visible band spectrometers may be used. In particular, visible and near-UV capability (from approximately 200 nm to 700 nm) allows for the detection of many atomic emission lines characteristic of electrical breakdowns, while visible and near-IR capability (from approximately 500 nm to 1100 nm) provides the ability to estimate surface temperatures from the shape of a blackbody emission curve.

As further shown in FIG. 1, the data acquisition system 140 also includes a photodetector 152 positioned within the chamber 112 proximate the test specimen 116, and cameras 154 positioned at various locations around the chamber 112. The photodetector 152 and cameras 154 are oriented to view sparks emitted by the test specimen 116 within the test section 114. In alternate embodiments, additional photodetectors (e.g. a second photodetector 153) and their preamplifiers may be positioned within the chamber 112, either proximate to (e.g. under, adjacent to, collocated with, etc) or spaced apart from the photodetector 152. The use of addition photodetectors allows the user of the apparatus to select both high and low gains for the various photodetector circuits, thus improving the likelihood that at least one of the photodetectors will register light effectively. As shown in FIG. 1, the cameras 154 may include Polaroid cameras 154A and digital cameras 154B, however, in alternate embodiments, any other suitable types of camera or detectors may be used.

Figure 2:
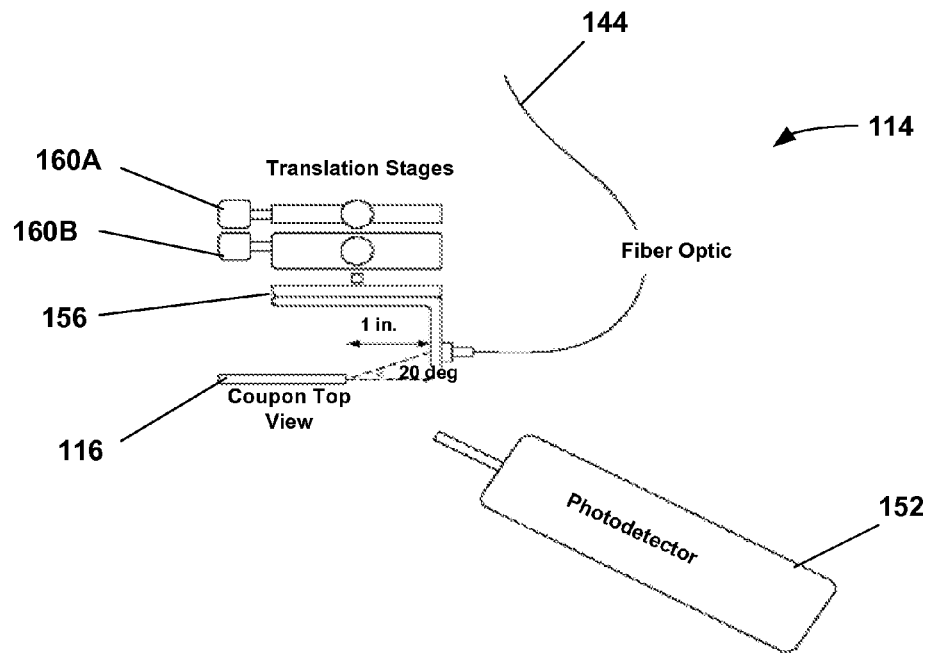
FIG. 2 is an enlarged top view of a test section portion of the system of FIG. 1.
Figure 3:
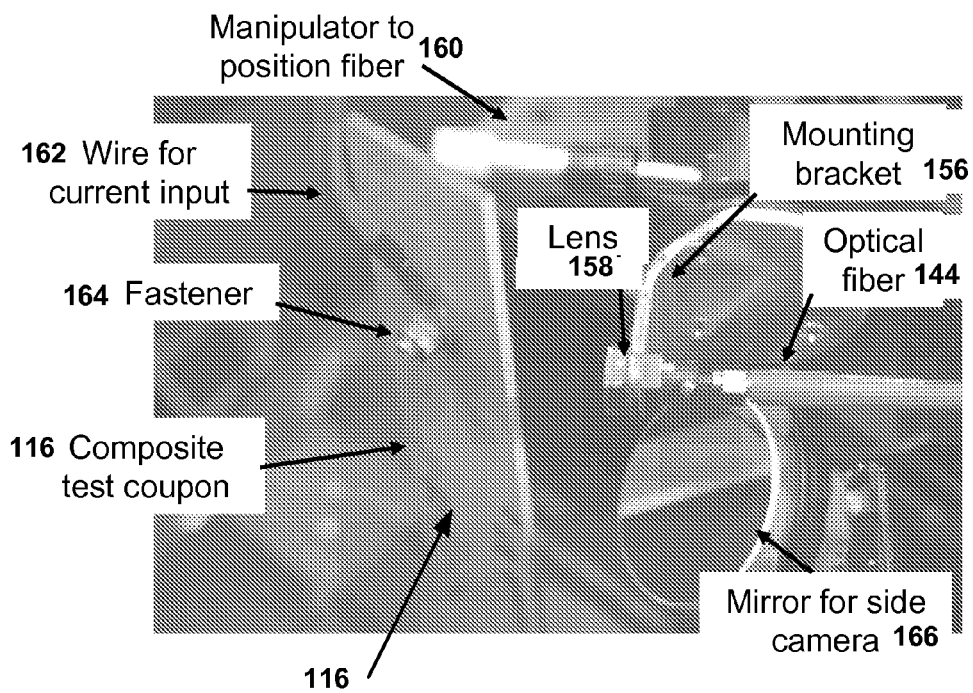
FIG. 3 is an enlarged partial isometric view of the test section of the system of FIG. 1.

FIGS. 2 and 3 are enlarged views of the test section 114 of the system 100 of FIG. 1. In this embodiment, the optical fiber 144 is fastened to a mounting bracket 156, and a lens 158 (FIG. 3) is positioned over the second end of the optical fiber 144. The lens 158 is a collimating lens that increases the acceptance angle for incoming light and collimates the light for more efficient coupling of light. The mounting bracket 156 is coupled to first and second translation stages 160A, 160B that provide position control capability in first and second reference planes, respectively (e.g. x-y and x-z planes). Thus, the translation stages 160 enable relatively precise positioning of the optical fiber 144 with respect to the test specimen 116. As best shown in FIG. 3, a supply wire 162 for providing an electrical current during a test is coupled to the test specimen 116 by a fastener 164. A mirror 166 is positioned proximate the test specimen 116 and reflects light from the sparks emitted by the test specimen 116 to one or more of the cameras 154.

It will be appreciated that the components of the data acquisition system 140 may be variably positioned, and that the invention is not limited to the particular embodiment of data acquisition system 140 described above and shown in FIGS. 1-3. In alternate embodiments, the positions of the optical fiber 144, photodetector 152, and cameras 154 may be adjusted from the configuration shown in FIGS. 1-3, to enable investigation of view-angle dependence on the spectral and time profile characteristics of the composite material sparking phenomenon.

Figure 4:
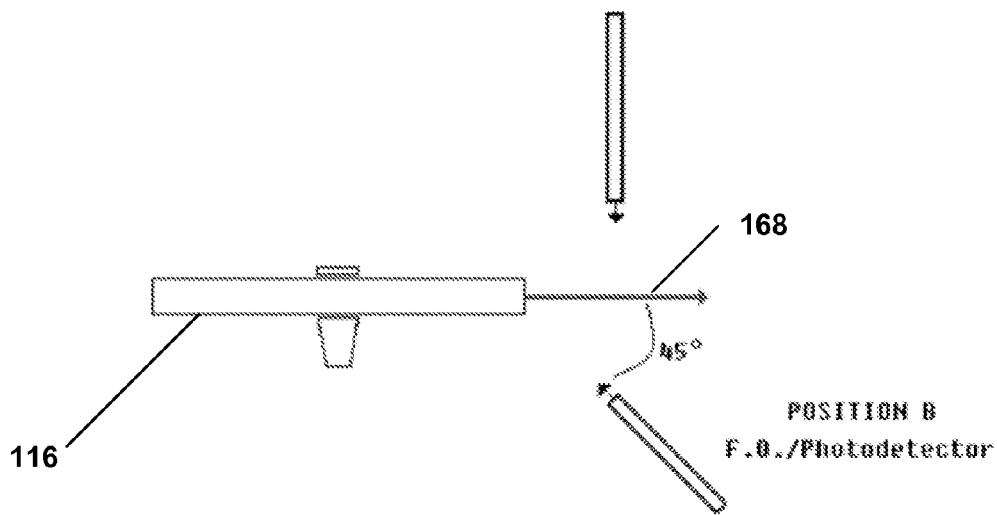
FIG. 4 is an enlarged partial isometric view of the test section in accordance with an alternate embodiment of the invention.

For example, FIG. 4 is an enlarged partial isometric view of the test section 114 in accordance with an alternate embodiment of the invention. In this embodiment, light-gathering components of the data acquisition system 140 (e.g. photodetector 152, optical fiber 144, etc.) may be positioned at a first position A and a second position B. The first and second positions A, B are oriented at approximately 90 degree and 45 degree angles, respectively to an axis 168 of the test specimen 116 along which sparks may generally emanate during a test. The light-gathering components of the data acquisition system 140 may be positioned at either (or both) of the first and second positions A, B. In further embodiments, the light-gathering components may be positioned at any other desired positions relative to the test specimen 116.

While not intending to be bound by theory, it is suspected that there may be a view-angle dependence in the spectral and time profile of at least some sparking modes, including an edge glow mode. Edge glow is a complex event consisting of several components. For example, one component of the event may include surface effects such as heat and surface glow. Another component of the event may include ejected particles and plasma. Each piece may have a different time profile and a different spectral profile. With reference to FIG. 4, when viewed from the first position A, it is anticipated that the characteristics seen would result substantially from ejected particles and plasma, and when viewed from the second position B, it is anticipated that the characteristics seen would be mostly from surface effects. In alternate embodiments, both optical fibers and photodetectors may be positioned at the first and second positions A, B in order to capture and characterize each of the pieces of the edge glow phenomenon.

The photodetector 152 of the optical spark mode discriminator system 100 has suitably fast response characteristics to enable proper characterization of the composite material sparking phenomenon. Previously-known photodetectors may be suitable for this purpose. Alternately, the photodetector 152 may include a photodetector circuit in accordance with an alternate embodiment of the invention, as described below.

Figure 5:
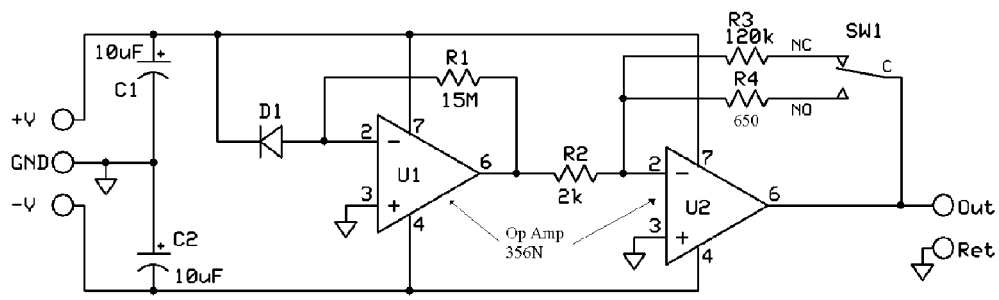
FIG. 5 is a schematic representation of a photodetector circuit in accordance with an embodiment of the invention.

FIG. 5 is a schematic representation of a photodetector circuit 500 in accordance with an alternate embodiment of the invention. The photodetector circuit 500 advantageously provides relatively fast response characteristics and includes bypass capacitors for improved noise immunity. The photodiode D1 of the photodetector circuit 500 preferably has a fast rise time in relation to typical lightning waveforms (e.g. less than approximately 6 microseconds). For example, in one particular embodiment, the photodiode is a Model BPW43 photodiode commercially-available from Vishay Semiconductor GmbH of Heilbronn, Germany.

The balance of the photodetector preamplifier circuit 500 also affects the risetime of the detected light. In particular, the connection of the feedback resistor R1 from the output to the input of the operational amplifier U1 gives this circuit the transimpedance form. Transimpedance amplifiers are advantageous for measuring photocurrents because they minimize the effect of photodiode capacitance while maintaining high gain (due to the large feedback resistor R1) and fast risetime. The resistor R1 will typically be of 1 megohm or more to provide high signal. The second stage of gain in the circuit of FIG. 5 is provided by a second operational amplifier U2 and various feedback resistors R2, R3, and R4, chosen in a manner well known to those skilled in analog circuit design. An additional switch may be provided to improve flexibility in handling varying test conditions including differing light outputs, viewing conditions, or electrical noise environments.

Figure 6:
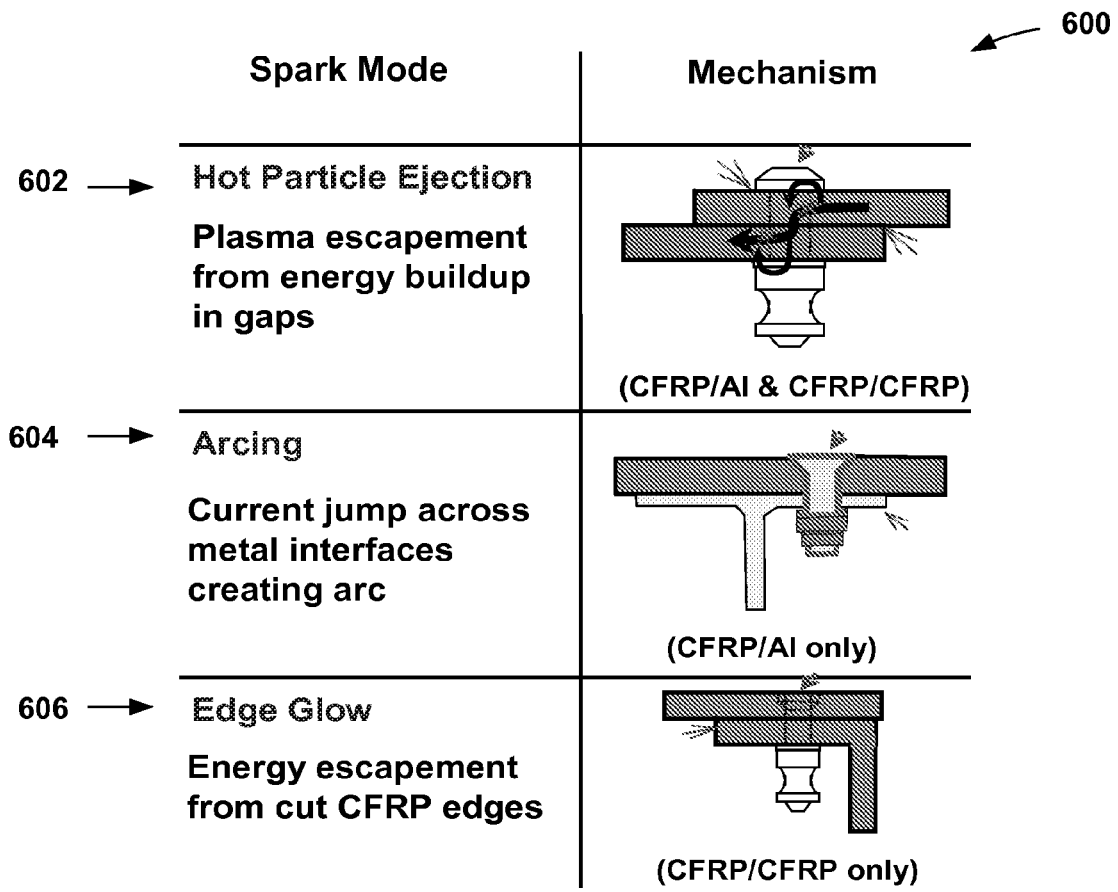
FIG. 6 is a table listing three spark modes that may be detected and discriminated using methods and systems in accordance with the invention.

As noted above, embodiments of the invention are preferably adapted to provide improved capabilities for analyzing and discriminating between various modes of composite material sparking. For example, FIG. 6 is a table 600 listing three possible modes by which sparking may be induced in composite materials. In a hot particle ejection mode 602, sparks of burning metallic particles may be emitted from under a fastener head or collar. A possible mechanism for the hot particle ejection mode 602 is the energy buildup (electrical or thermal) at gap or interfaces between two articles of composite material, or between a composite material (e.g. carbon-fiber reinforced panel) and a non-composite (e.g. aluminum or titanium) material. In an arcing mode 604, visible light as well as thermal and plasma energy in the gas may be emitted as current arcs (or jumps) between interfaces. A possible mechanism for the arcing mode 604 includes the formation of a conducting plasma across interfaces between a composite material and a non-composite (e.g. metal) material. In an edge glow mode 606, sparks may be emitted as energy escapes from edges (e.g. cut edges) of a composite material. This energy is likely to take the form of surface hearting, possibly also including the emission of burned or volatilized composite materials. Each of the various modes 602, 604, 606 may have a different time profile and a different spectral profile that may be detected and analyzed using the systems and methods disclosed herein.

More specifically, in operation, an electrical current is applied to the test specimen 116 via the supply wire 162 (FIG. 3) to the fastener 164 causing sparking by the test specimen 116. The data acquisition system 140 collects and records the data acquired by the spectrometer assembly 142, the photodiode 152, and possibly one or more of the cameras (non-Polaroid) 154 during the sparking test. These data may then be analyzed to discriminate one or more of the various modes of sparking identified in FIG. 6.

Figure 7:
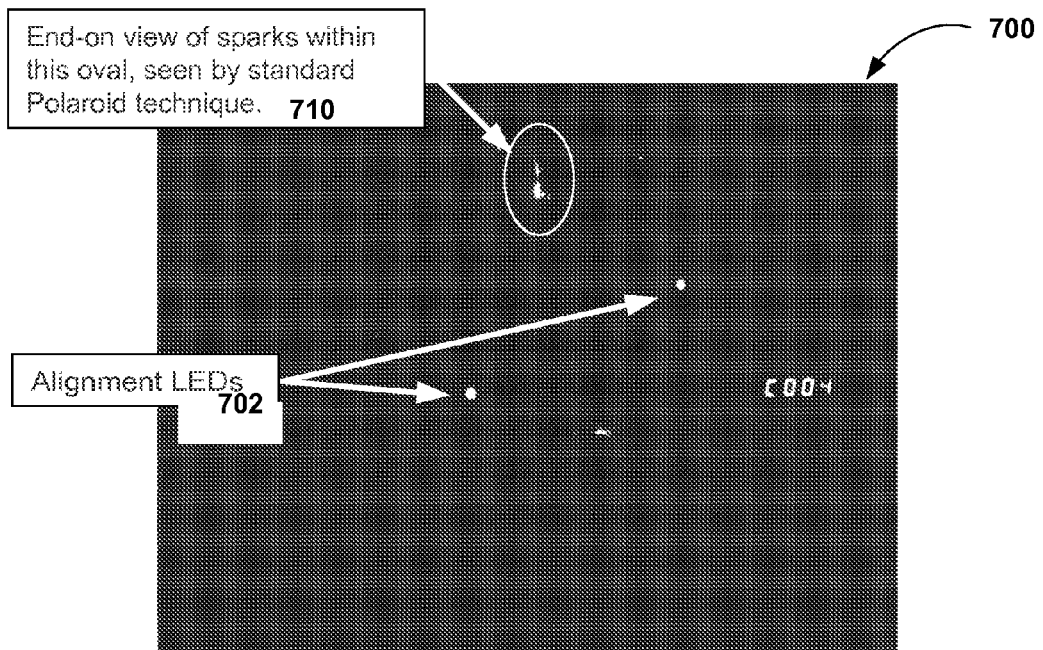
FIGS. 7 and 8 are photographs of a spark test performed using the system in accordance with an embodiment of the invention.

During the spark test, the cameras 154 may record photographs of the sparks emitted by the test specimen. For example, FIG. 7 is a traditional Polaroid photograph 700 of a spark test performed using the optical spark mode discriminator system 100. In this example, the photograph 700 is an end-view of the test specimen 116 during the spark test, such as may be taken by the camera 154A positioned at the north end of the chamber 112 shown in FIG. 1. Light emitted by a pair of alignment LEDs (Light Emitting Diodes) 702 is recorded on the photograph 700 to facilitate comparison between photographs of successive tests. Light emitted by the sparks 710 emanating from the test specimen 116 is also recorded. It is apparent from FIG. 7 that the traditional Polaroid photograph 700 provides relatively little data for analysis and discrimination of the possible modes of the sparks emitted from the test specimen 116.

Figure 8:
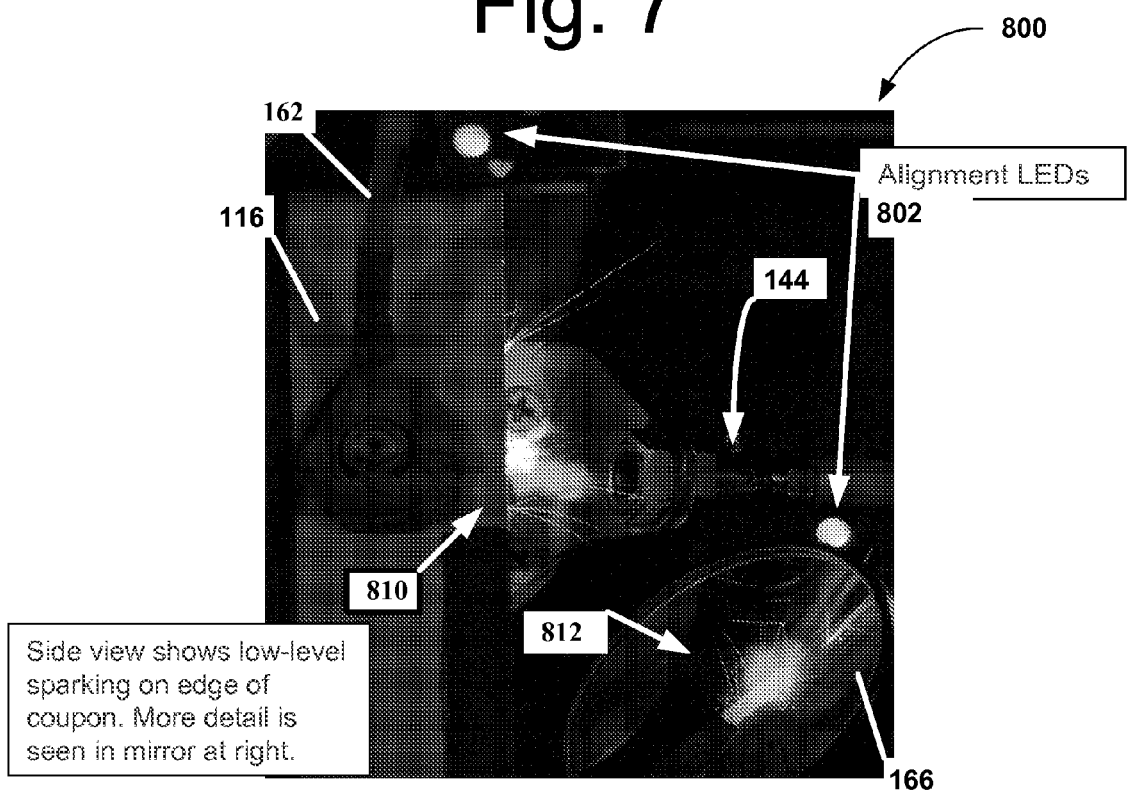

FIG. 8 is a digital photograph 800 of the spark test from a side view of the test specimen 116, such as may be taken by the digital camera 154B positioned on the east side of the chamber 112 (FIG. 1). Again, light emitted by a pair of alignment LEDs 802 is recorded on the photograph 800 to facilitate comparison with other photographs. Direct light 810 emitted by the sparks during the test is recorded on the photograph 800, as well as indirect light 812 reflected from the mirror 166 (FIG. 3). The side view digital photograph 800 provides additional data for analysis and discrimination of the possible spark modes.

Figure 9:
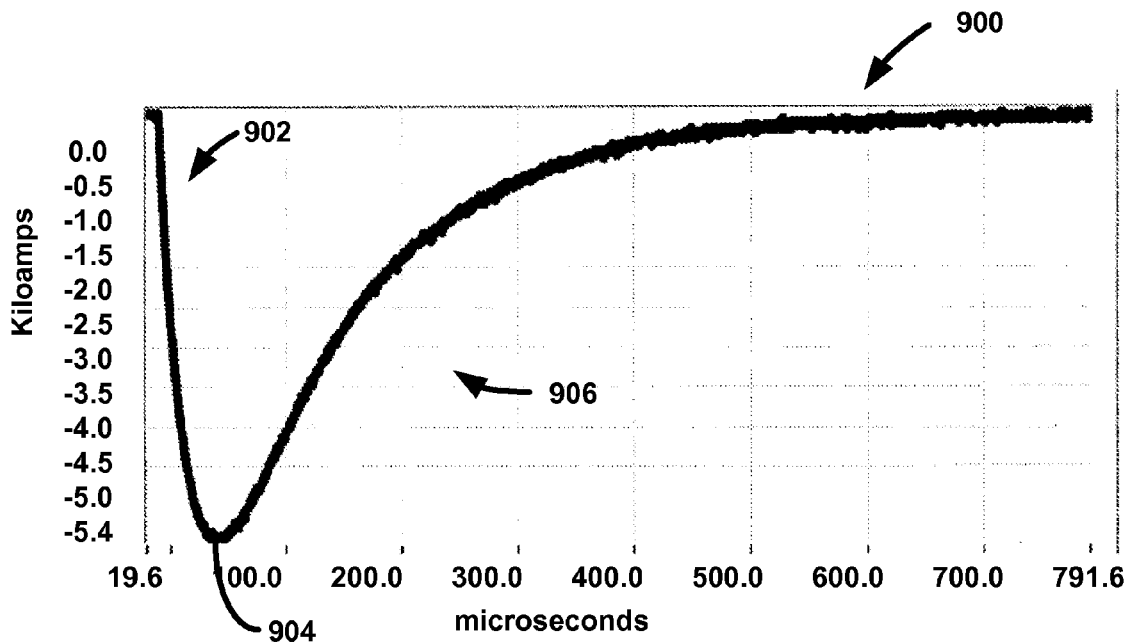
FIGS. 9 and 10 are graphs of input current and light output, respectively, from a spark test performed using the system in accordance with an embodiment of the invention.

FIG. 9 is a graph 900 of an input current versus time during a representative spark test performed using the system 100 of FIG. 1. In this embodiment, the input current is intended to simulate a lightning strike on the test specimen 116. In alternate embodiments, the profile of the input current may be adjusted to simulate other types of phenomena. As shown in FIG. 9, the input current (plotted in negative kiloamps) includes a relatively-short rise-time phase 902 (appearing at between approximately −20 microseconds and 50 microseconds in the figure) leading to a peak current 904 (at approximately 50 microseconds), and then followed by a relatively-longer drop-off phase 906 (between approximately 50 microseconds and 700 microseconds). The gradual rise of the emitted light is indicative of primarily thermal sparking. If the spark mode had been that of electrical breakdown, it is more probable that the light output would rise abruptly at the time that voltage differentials at the surface of the specimen exceeded the breakdown potential of air.

Figure 10:
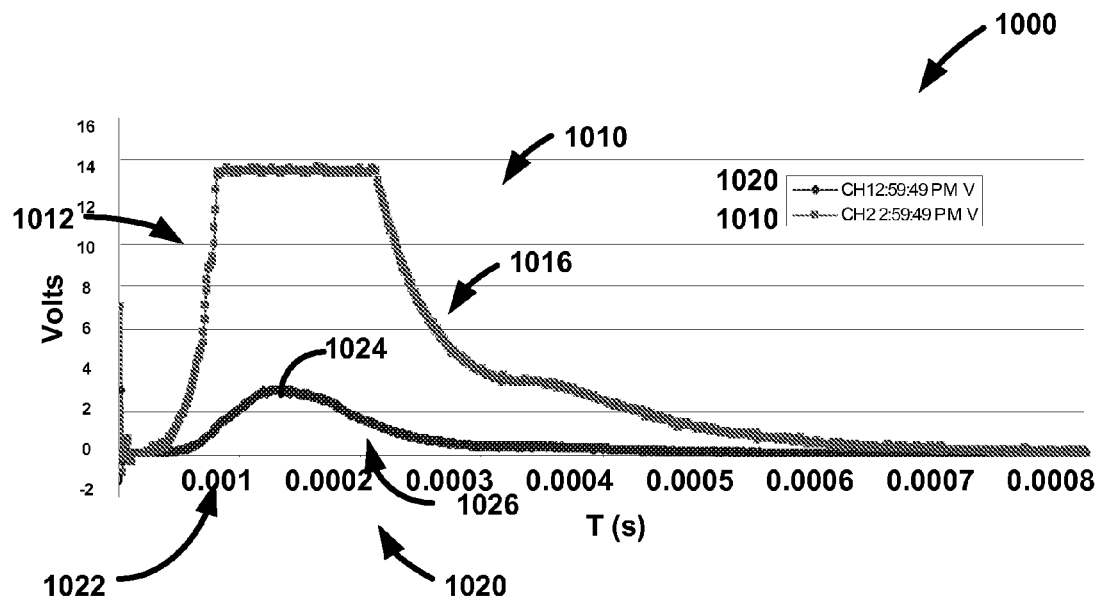

FIG. 10 is a graph 1000 of light intensities recorded by a pair of photodetectors during the representative spark test of FIG. 9. More specifically, first light intensities 1010 recorded by the first photodetector are plotted using "squares" while second light intensities 1020 recorded by a second photodetector are plotted using "diamonds." In this embodiment, the first photodetector has a relatively-higher gain than the second photodetector. For the experiment shown, the profile shapes of the first and second light intensities 1010, 1020 obtained using the photodetectors are similar to the profile shape of the input current shown in FIG. 9. The first light intensity 1010 has a first rise-time phase 1012 and a first drop-off phase 1016. The second light intensity 1020 has a second rise-time phase 1022, a peak light intensity 1024, and a second drop-off phase 1026. In this embodiment, the peak light intensity 1024 (occurring at approximately 150 microseconds) substantially tags behind the peak input current 904 (FIG. 9) (occurring at approximately 50 microseconds) by approximately 100 microseconds. This is also indicative of thermal phenomena, representing cooling of surfaces rather than the abrupt extinction of an electrical breakdown. The use of two photodetectors and preamplifier circuits allowed one channel to saturate while the other channel (with a 10× gain reduction) is well within range.

It will be appreciated that systems having first and second photodetectors (e.g. photodetectors 152, 153) with different gain settings may advantageously provide an improved characterization of the light emitted by sparks during a test. For example, as shown in FIG. 10, the first photodetector having the relatively-higher gain provides improved characterization of the sparking phenomenon during the first rise-time phase 1012 and during the first drop-off phase 1016, while the second photodetector having the relatively-lower gain provides improved characterization of the peak light intensity 1024.

While not intending to be bound by theory, it is believed that the characteristics of the one or more light intensity profiles detected by the one or more photodetectors may depend upon the particular sparking mode being observed. These characteristics (e.g. rise-time, drop-off time, peak intensity, etc.) may be used to classify and discriminate between the various sparking modes. In some embodiments, for example, the recorded light intensity profiles may be compared with empirical data (or analytically-derived data) for various sparking modes over a variety of different variables (e.g. viewing angle, composite material, input voltage, environmental conditions, etc.), and the sparking mode may be classified based on a "best fit" or "best match" between the test data profile and the comparison data profiles. An example of empirical data is the emitted light spectrum from a blackbody calibration source or a hot filament of known temperature. An example of an analytically-derived comparison curve is the Stefan-Boltzmann equation that gives spectral density and intensity as a function of temperature. A variety of algorithms for performing such comparisons between data sets are known, and for the sake of brevity, will not be described in detail herein. In addition, the implementation of such algorithms into computers or other types of processing components (including the processing component 148) suitable for performing the necessary calculations involved in such algorithms is also known.

Figure 11:
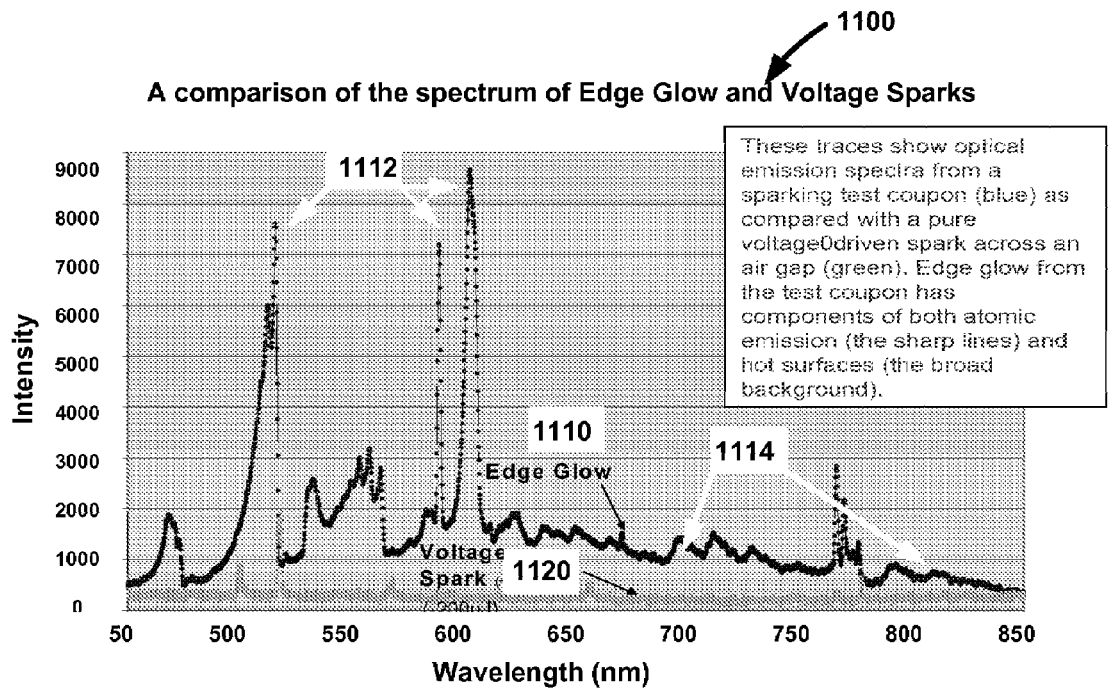
FIG. 11 is a graph comparing the light intensity spectra from of an edge glow mode and from a voltage spark mode.

Further improvements in the characterization of the energy and duration of the sparks emitted during a test may be afforded by the data obtained using the spectrometer assembly 142. For example, FIG. 11 is a graph 1100 comparing the light intensity spectra from an edge glow mode 1110 and from a voltage spark mode 1120. More specifically, the light intensity spectrum for the edge glow mode 1110 was obtained using the spectrometer assembly 142 during a sparking test with a test specimen 116 using the spectrometer assembly 142 of the system 100 as described above. Similarly, the light intensity spectrum for the voltage spark mode 1120 was obtained using the spectrometer assembly 142 to record a pure voltage-driven spark across an air gap.

As shown in FIG. 11, while not intending to be bound by theory, the edge glow mode 1110 is believed to have components of both atomic emissions (the sharp lines) 1112 and hot surfaces (the broad background) 1114, while the voltage spark mode 1120 exhibits a spectrum of isolated atomic emission lines with little background, indicative of a relatively-purely arcing phenomenon. These differences between the spectra from the edge glow and voltage spark modes 1110, 1120 provide a means of discriminating between these two modes of composite material sparking, such as by using the "best fit" or "best match" methodology described above.

Figure 12:
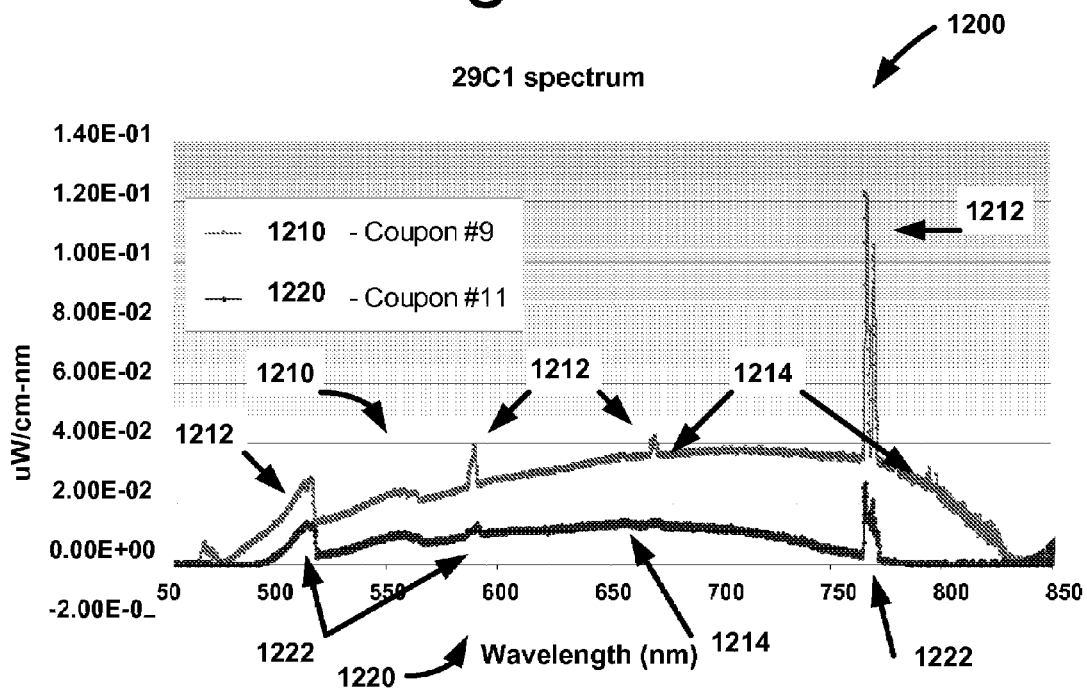
FIG. 12 is a graph of light intensity versus wavelength for two test coupons in an edge glow mode.

Embodiments of the invention may also be used to determine the sparking characteristics of a composite material under different test conditions (e.g. different input currents, environmental characteristics, etc.), or to compare the sparking characteristics of different composite materials. For example, FIG. 12 is a graph 1200 of light intensity spectra from two test coupons exhibiting edge glow. A first light intensity spectrum 1210 (test coupon 9) has a relatively-higher overall magnitude of light intensities, and a second light intensity spectrum 1220 (test coupon 11) has a relatively-lower overall magnitude of light intensities. Both the first and second light intensity spectra 1210, 1220 include components of both atomic emissions 1212. 1214 and broad blackbody emissions (hot surfaces) 1214, 1224 indicative of the edge glow mode as described above. The broad blackbody emissions 1214, 1224 are more apparent on FIG. 12 than in the particular embodiment of edge glow 1110 shown above in FIG. 11.

Embodiments of systems and methods in accordance with the present invention may provide improved capabilities for analyzing and discriminating between various modes of composite material sparking. For example, embodiments of the invention may allow improved characterization of the energy and duration of a spark, and may provide capabilities to analyze the spectral and temporal characteristics of different sparks. The characteristics may be analyzed and used for the purpose of classifying the mode by which the sparks were induced.

Although some information about spark modes can be determined from standard photographic methods, these methods are typically limited only to very large sparks or showers. Prior art methods also rely on cameras placed at standard distances (about 42 inches) from the test article, thereby undesirably limiting the spatial resolution necessary for recording small events. Embodiments of the present invention mitigate and overcome these disadvantages of the prior art. Embodiments of the present invention are relatively low cost, compact, and versatile, and may be used for a large number and variety of tests needed to support aircraft certification.

While preferred and alternate embodiments of the invention have been illustrated and described, as noted above, many changes can be made without departing from the spirit and scope of the invention. Accordingly, the scope of the invention is not limited by the disclosure of these preferred and alternate embodiments. Instead, the invention should be determined entirely by reference to the claims that follow.

What is claimed is:

1. A method of classifying a sparking mode of a workpiece, comprising:
   receiving light from a spark emitted by the workpiece;
   transmitting the received light to a spectrometer;
   generating a light intensity spectrum from the received light using the spectrometer;
   analyzing the light intensity spectrum; and
   classifying the sparking mode based on the analysis of the light intensity spectrum, the sparking mode being from a group of modes that includes an edge glow mode, a voltage arcing mode, and a hot particle ejection mode.

2. The method of claim 1, wherein transmitting the received light to a spectrometer includes transmitting the received light through an optical fiber to the spectrometer.

3. The method of claim 1, wherein analyzing the light intensity spectrum includes analyzing the light intensity spectrum for the presence of an atomic emission and a broad blackbody emission, and wherein classifying the sparking mode includes classifying the sparking mode based on at least one of the presence and absence of the atomic emission and the broad blackbody emission.

4. The method of claim 1, further comprising inducing the sparking mode of the workpiece within an ignitable mixture.

5. The method of claim 1, wherein analyzing the light intensity spectrum includes comparing the light intensity spectrum with at least one of an empirical spectrum and an analytically-derived spectrum.

6. The method of claim 5, wherein classifying the sparking mode includes classifying the sparking mode based on at least one of a best fit and a best match between the light intensity spectrum and the at least one of the empirical spectrum and the analytically-derived spectrum.

7. The method of claim 1, further comprising:
receiving a second portion of light emitted by the spark into at least one photodetector;
determining at least one intensity profile of the second portion of light;
analyzing the at least one intensity profile; and
wherein classifying the sparking mode includes classifying the sparking mode based on the analysis of the at least one intensity profile.

8. The method of claim 7, wherein analyzing the at least one intensity profile includes analyzing at least one of a rise-time phase, a peak intensity, and a drop-off phase.

9. The method of claim 8, wherein analyzing the at least one intensity profile includes comparing the at least one intensity profile with at least one of an empirical intensity profile and an analytically-derived intensity profile.

10. The method of claim 7, determining at least one intensity profile of the second portion of light includes determining a first intensity profile using a first photodetector gain and determining a second intensity profile using a second photodetector gain.

11. A method of classifying a sparking mode of a workpiece, comprising:
receiving a first portion of light emitted by the workpiece into a spectrometer;
receiving a second portion of light emitted by the workpiece;
analyzing a light intensity spectrum of the first portion of light;
analyzing an intensity profile of the second portion of light; and
classifying the sparking mode based on the analysis of the light intensity spectrum and the analysis of the intensity profile, the sparking mode being from a group of modes that includes an edge glow mode, a voltage arcing mode, and a hot particle ejection mode.

12. The method of claim 11, wherein analyzing a light intensity spectrum includes analyzing a light intensity spectrum for the presence of an atomic emission and a broad blackbody emission.

13. The method of claim 12, wherein classifying the sparking mode includes classifying the sparking mode based on at least one of presence and absence of the atomic emission and the broad blackbody emission, and wherein analyzing an intensity profile includes analyzing at least one of a rise-time phase, a peak intensity, and a drop-off phase.

14. The method of claim 11, further comprising inducing the sparking mode of the workpiece within an ignitable mixture.

15. The method of claim 11, wherein at least one of analyzing a light intensity spectrum and analyzing an intensity profile includes comparing at least one of the light intensity spectrum and the intensity profile with at least one of an empirical data set and an analytically-derived data set.

16. A system for analyzing a sparking mode of a workpiece, comprising:
a test section configured to receive the workpiece, where the workpiece includes a carbon fiber composite portion;
an electrical supply assembly coupled to the workpiece that includes the carbon fiber composite portion and configured to supply an input current into the workpiece; and
a data acquisition assembly including:
a spectrometer assembly including a spectrometer configured to receive light emitted by the workpiece that includes the carbon fiber composite portion, and to provide a light intensity spectrum; and
a processing component coupled to the spectrometer, the processing component being configured to receive the light intensity spectrum and to analyze the light intensity spectrum to determine the sparking mode of the workpiece, the sparking mode being from a group of modes that includes an edge glow mode, a voltage arcing mode, and a hot particle ejection mode.

17. The system of claim 16, further comprising a vessel substantially enclosing the test section and configured to substantially contain an ignitable mixture introduced into the test section.

18. The system of claim 16, wherein the data acquisition assembly further comprises a photodetector configured to receive a second portion of light and to provide an intensity profile, and wherein the processing component is further configured to analyze the light intensity spectrum for the presence of an atomic emission and a broad blackbody emission, and to analyze the light intensity profile for at least one of a rise-time phase, a peak intensity, and a drop-off phase.

19. The system of claim 16, wherein the processing component is further configured to analyze the intensity profile to determine the sparking mode of the workpiece.

20. The system of claim 16, wherein the data acquisition assembly further comprises a camera configured to receive a second portion of light and to provide an image of the second portion of light emitted by the workpiece.

* * * * *